United States Patent
Chen

(10) Patent No.: US 11,948,648 B2
(45) Date of Patent: Apr. 2, 2024

(54) SEMICONDUCTOR MEMORY APPARATUS

(71) Applicant: Winbond Electronics Corp., Taichung (TW)

(72) Inventor: Chung-Zen Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 227 days.

(21) Appl. No.: 17/568,676

(22) Filed: Jan. 4, 2022

(65) Prior Publication Data

US 2023/0215504 A1    Jul. 6, 2023

(51) Int. Cl.
| | |
|---|---|
| G11C 16/04 | (2006.01) |
| G11C 16/08 | (2006.01) |
| G11C 16/14 | (2006.01) |
| G11C 16/24 | (2006.01) |
| G11C 16/26 | (2006.01) |
| G11C 16/30 | (2006.01) |
| G11C 16/34 | (2006.01) |

(52) U.S. Cl.
CPC .......... *G11C 16/3472* (2013.01); *G11C 16/08* (2013.01); *G11C 16/14* (2013.01); *G11C 16/24* (2013.01); *G11C 16/26* (2013.01); *G11C 16/30* (2013.01)

(58) Field of Classification Search
CPC ..... G11C 16/14; G11C 11/4097; G11C 16/02; G11C 16/08; G11C 16/10; G11C 16/24; G11C 11/4023; G11C 14/0018; G11C 16/0466; G11C 11/405
See application file for complete search history.

(56) References Cited

U.S. PATENT DOCUMENTS

| | | | |
|---|---|---|---|
| 5,790,456 A | 8/1998 | Haddad | |
| 6,818,491 B2 | 11/2004 | Lee et al. | |
| 7,457,166 B2 | 11/2008 | Hemink et al. | |
| 8,274,829 B2 | 9/2012 | Lee et al. | |
| 8,345,481 B2 | 1/2013 | Lee et al. | |
| 2005/0057972 A1* | 3/2005 | Taito | G11C 16/3418 365/185.28 |
| 2007/0064480 A1* | 3/2007 | Kuo | G11C 16/0491 365/185.03 |

FOREIGN PATENT DOCUMENTS

TW             202034330         9/2020

OTHER PUBLICATIONS

"Office Action of Taiwan Counterpart Application", dated May 11, 2022, p. 1-p. 6.

* cited by examiner

*Primary Examiner* — Uyen Smet
(74) *Attorney, Agent, or Firm* — JCIPRNET

(57) ABSTRACT

A semiconductor memory apparatus including a memory cell array, a switch circuit, and a sensing circuit is provided. The memory cell array includes multiple memory cells. The switch circuit includes at least one switch. Each of the switch receives a control signal and is turned on or off under control of the control signal. When an erase verification is performed, the sensing circuit sequentially receives an erase verification current generated by each of the memory cells through the switch circuit to verify an erase state of the each of the memory cells.

8 Claims, 9 Drawing Sheets

US 11,948,648 B2

SEMICONDUCTOR MEMORY APPARATUS

BACKGROUND

Technical Field

This disclosure relates to a memory apparatus, and in particular to a semiconductor memory apparatus used to store option bits or a status bits required to power up a chip.

Description of Related Art

In memory products, there are some mini-arrays used for storing option bits or status bits in addition to the main memory. Option bits or status bits are information necessary for memory operation, such as the relevant parameters that determine operation. This necessary information is read during power-up of the memory product. Typically, the reading voltage applied to the bit lines in the mini-array needs to be controlled to correctly read the option bits or status bits from the memory cell.

In order to provide a stable voltage source, bandgap reference (BGR) circuits are widely used in memory products. A BGR circuit is a voltage reference circuit that generates a substantially constant voltage regardless of power changes, temperature changes, and changes in circuit load from on-chip devices or off-chip devices. The BGR circuit can be used to generate a reference voltage when the memory product is powered up. At this time, the charge pump circuit can generate a reading voltage applied to the bit line according to the reference voltage to read the option bits or status bits from the memory cell.

However, during power-up, the BGR circuit is not yet able to provide accurate reference voltages because the supply voltage (VCC) may be unstable. Therefore, there is no guarantee that the charge pump circuit can generate a predetermined reading voltage based on the reference voltage. The reading voltage may not reach the target value, resulting in errors in the reading of the option bits or status bits.

SUMMARY

The disclosure provides a semiconductor memory apparatus that correctly reads information from option bits or status bits during power-up.

The semiconductor memory apparatus of the disclosure includes a memory cell array, a switch circuit, and a sensing circuit. The memory cell array includes multiple memory cells. The switch circuit is coupled to the memory cell array and includes at least one switch. Each of the switch receives a control signal, and is turned on or off under control of the control signal. The sensing circuit is coupled to the switch circuit. When an erase verification is performed, the sensing circuit sequentially receives an erase verification current generated by each of the memory cells through the switch circuit to verify an erase state of the each of the memory cells.

Based on the above, the sensing circuit may simultaneously receive at least two reading currents from the memory cell when a read operation is performed on the option bits or the status bits during power-up. Therefore, a problem that a reading voltage does not reach a target value and the reading current decreases may be solved, and a margin of the read operation increases, so that the option bits or status bits may be read correctly.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
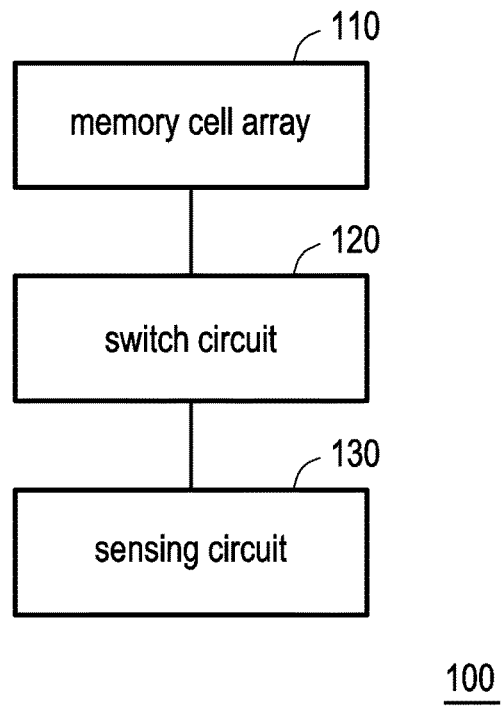
FIG. 1 is a block diagram of a semiconductor memory apparatus according to an embodiment of the disclosure.
Figure 2:
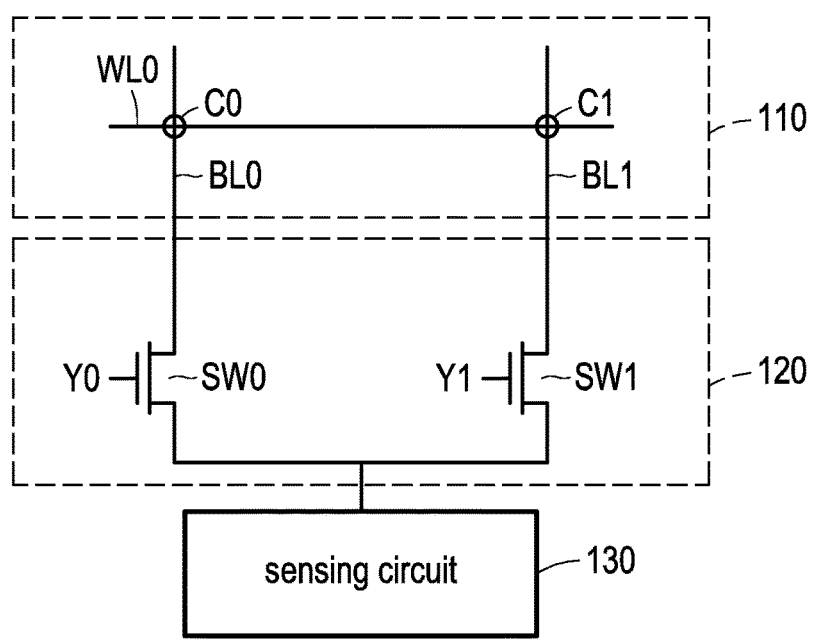
FIG. 2 is a schematic circuit diagram of a semiconductor memory apparatus according to an embodiment of the disclosure.

FIG. 1 is a block diagram of a semiconductor memory apparatus according to an embodiment of the disclosure. FIG. 2 is a schematic circuit diagram of a semiconductor memory apparatus according to an embodiment of the disclosure. Referring FIG. 1 and FIG. 2 at the same time, a semiconductor memory apparatus 100 includes a memory cell array 110, a switch circuit 120, and a sensing circuit 130. The memory cell array 110 includes memory cells C0 and C1. In this embodiment, the memory cell array 110 is, for example, a mini-array in a NOR flash memory, and the memory cells C0 and C1 are, for example, configured to store option bits or status bits.

As shown in FIG. 2, the memory cells C0 and C1 are coupled together to a word line WL0, and are respectively coupled to the switch circuit 120 and the sensing circuit 130 through different bit lines BL0 and BL1. For ease of understanding, two memory cells are used in this embodiment for illustration purposes, but the disclosure is not limited thereto. As long as it conforms to a circuit structure in which the memory cells are coupled together to a word line and coupled respectively to the sensing circuit through different bit lines, those skilled in the art may extrapolate a number of the memory cells used to a greater number depending on actual needs according to teachings of the disclosure.

The switch circuit 120 is coupled to the memory cell array 110. The switch circuit 120 includes switches SW0 and SW1. The switch SW0 is disposed on the bit line BL0 and is coupled between the memory cell C0 and the sensing circuit 130. The switch SW1 is disposed on the bit line BL1, and is coupled between the memory cell C1 and the sensing circuit 130.

The switches SW0 and SW1 receive control signals Y0 and Y1, respectively. The switch SW0 may be turned on or off under control of the control signal Y0. The switch SW1 may be turned on or off under control of the control signal Y1. The switches SW0 and SW1 may be electronic components such as transistors. For example, when the control signal is at a high logic level (a turn-on level ONL), the switch controlled by the control signal will be turned on. When the control signal is at a low logic level (a turn-off level OFFL), the switch controlled by the control signal will be turned off. The turn-on level ONL is, for example, about 3 volts, and the turn-off level OFFL is, for example, about 0 volts. It should be noted that in other embodiments, the control signal may also control a state of the switch according to a logic level in an opposite manner to the foregoing, and the disclosure is not limited thereto.

The sensing circuit 130 is coupled to the switch circuit 120. The sensing circuit 130 includes, for example, a circuit composed of a sense amplifier, and an internal structure, a circuit operation, and implementation of the circuit may be adequately taught, advised and implemented by common knowledge of the technical field.

In this embodiment, when an erase verification is performed, the sensing circuit 130 may sequentially receive through the switch circuit 120 an erase verification current IEV0 generated by the memory cell C0 and an erase verification current IEV1 generated by the memory cell C1 to verify an erase state of each of the memory cells C0 and C1.

In order to explain in more detail how an erase operation, the erase verification, and a read operation are performed in this embodiment, please refer to FIG. 3A to FIG. 3E for the following description.

Figure 3A:
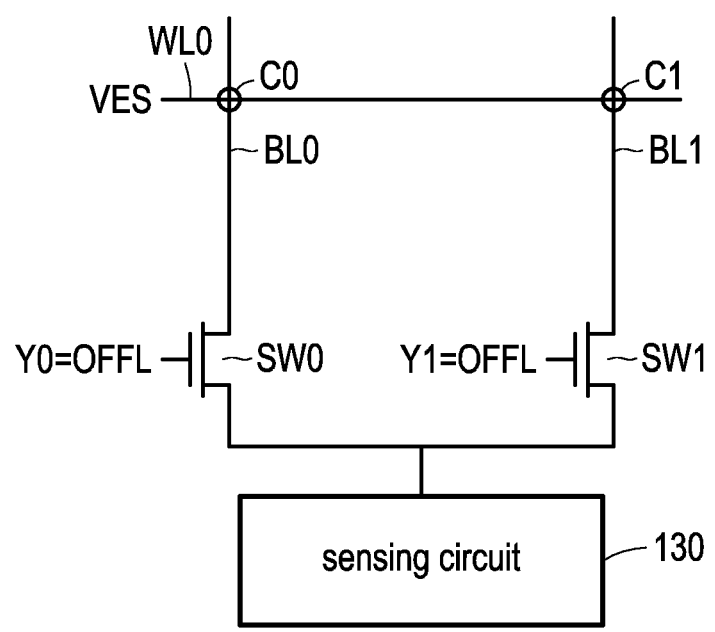
FIG. 3A is a schematic diagram of operation of an erase operation of a semiconductor memory apparatus according to an embodiment of the disclosure.

FIG. 3A is a schematic diagram of operation of an erase operation of a semiconductor memory apparatus according to an embodiment of the disclosure. Referring FIG. 3A, when the erase operation is performed, the switches SW0 and SW1 will be turned off based on the control signals Y0 and Y1 of the turn-off level OFFL, and the memory cells C0 and C1 will be simultaneously erased based on an erase voltage VES applied to the word line WL0. The erase voltage VES is, for example, about −9 volts. In this way, a data stored in the memory cells C0 and C1 will be erased, for example, to bit "1" to complete the erase operation.

Figure 3B:
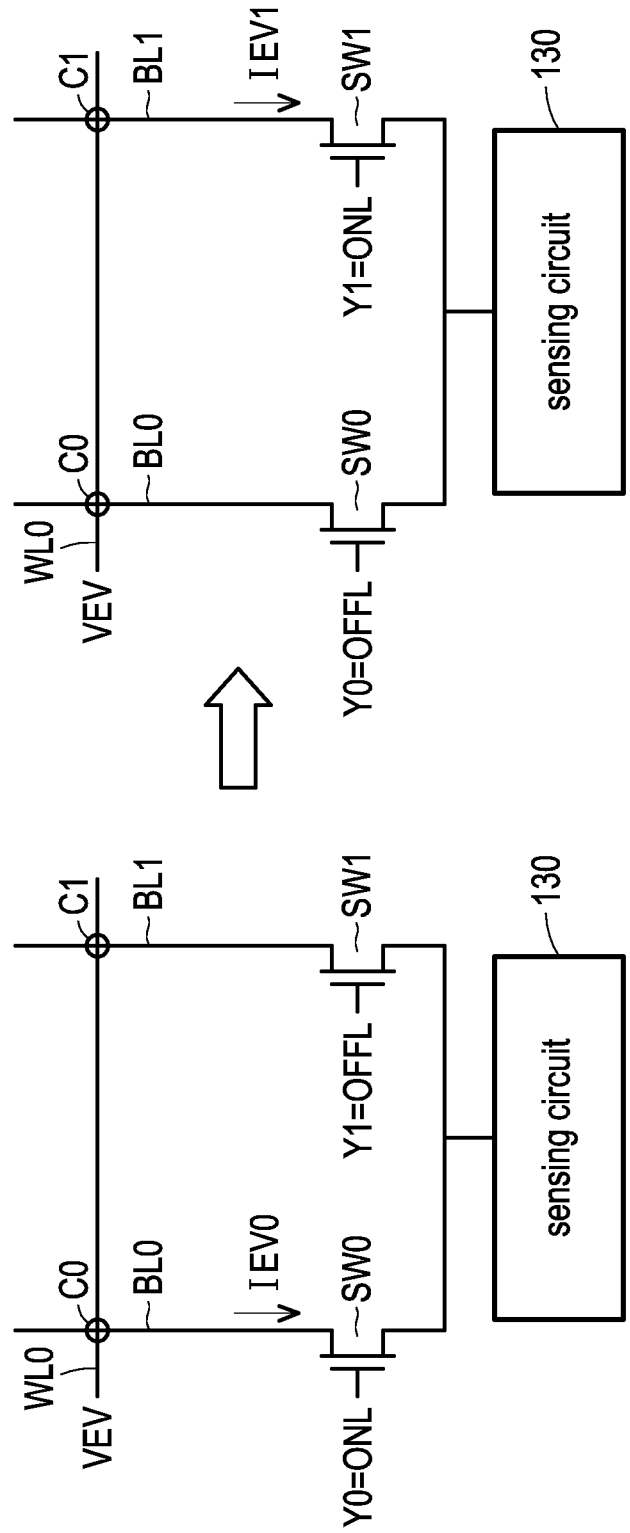
FIG. 3B is a schematic diagram of operation of an erase verification of a semiconductor memory apparatus according to an embodiment of the disclosure.
Figure 3C:
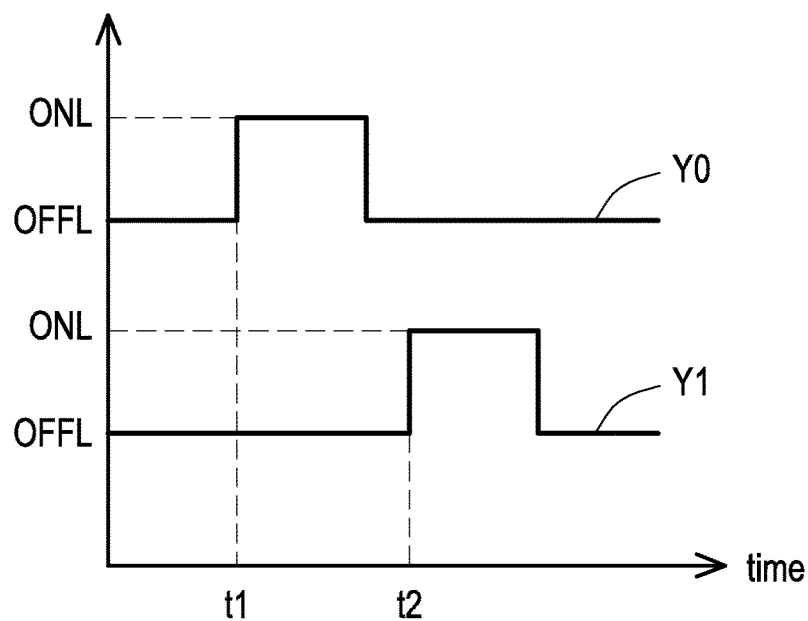
FIG. 3C is a signal sequence diagram of an erase verification of a semiconductor memory apparatus according to an embodiment of the disclosure.

FIG. 3B is a schematic diagram of operation of an erase verification of a semiconductor memory apparatus according to an embodiment of the disclosure. FIG. 3C is a signal sequence diagram of an erase verification of a semiconductor memory apparatus according to an embodiment of the disclosure. Referring to FIG. 3B and FIG. 3C at the same time, as shown in FIG. 3B, when the erase verification is performed, the sensing circuit 130 is enabled to sequentially receive the erase verification currents IEV0 and IEV1 (as shown from left to right in FIG. 3B) generated by the memory cells C0 and C1 by applying an erase verification voltage VEV to the word line WL0 and sequentially applying the control signals Y0 and Y1 of the turn-on level ONL to the switches SW0 and SW1. The erase verification voltage VEV is about 6 volts, for example. In other words, the memory cells C0 and C1 generate the verification currents IEV0 and IEV1 respectively based on the erase verification voltage VEV applied to the word line WL0. Also, as shown in FIG. 3C, the control signal Y0 changes from the turn-off level OFFL to the turn-on level ONL at a time point t1 to turn on the switch SW0 and enable the sensing circuit 130 to receive the erase verification current IEV0 generated by the memory cell C0. Then, the control signal Y1 changes from the turn-off level OFFL to the turn-on level ONL at a time point t2 to turn on the switch SW1 and enable the sensing circuit 130 to receive the erase verification current IEV1 generated by the memory cell C1.

In this way, the sensing circuit 130 may sequentially receive the erase verification current IEV0 generated by the memory cell C0 and the erase verification current IEV1 generated by the memory cell C1, and compare the erase verification currents IEV0 and IEV1 with a reference current respectively to complete the erase verification for memory cells C0 and C1 respectively. The reference current is, for example, 5 microamperes. For example, when the erase verification current IEV0 is greater than the reference current, it means that the memory cell C0 has passed the erase verification. When the erase verification current IEV0 is not greater than the reference current, it means that the memory cell C0 has not passed the erase verification.

Figure 3D:
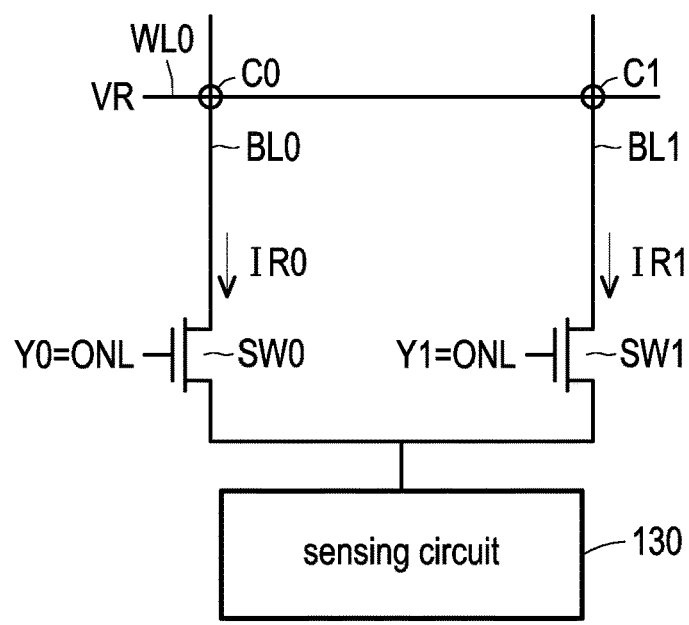
FIG. 3D is a schematic diagram of operation of a read operation of a semiconductor memory apparatus according to an embodiment of the disclosure.
Figure 3E:
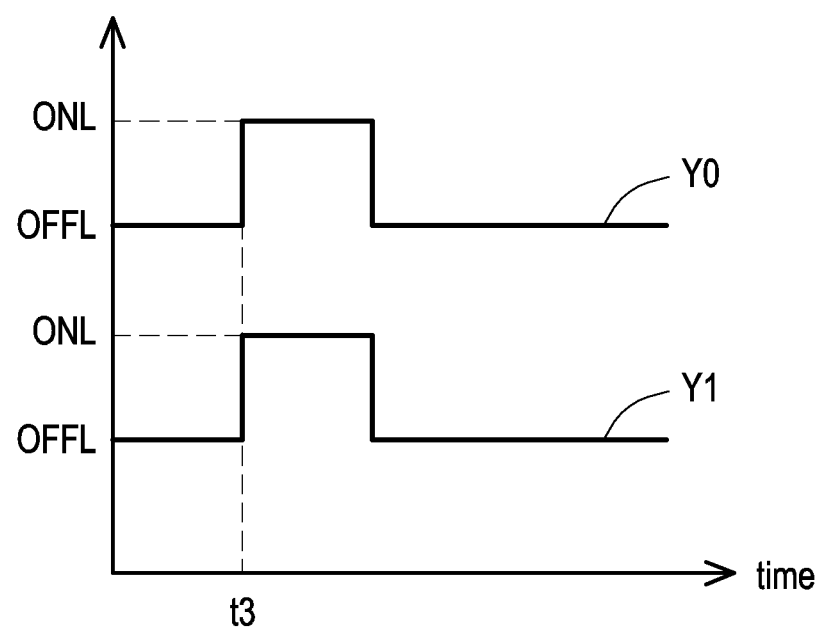
FIG. 3E is a signal sequence diagram of a read operation of a semiconductor memory apparatus according to an embodiment of the disclosure.

FIG. 3D is a schematic diagram of operation of a read operation of a semiconductor memory apparatus according to an embodiment of the disclosure. FIG. 3E is a signal sequence diagram of a read operation of a semiconductor memory apparatus according to an embodiment of the disclosure. The read operation in this embodiment is, for example, a read operation performed during power-up of the semiconductor memory apparatus 100. Referring FIG. 3D and FIG. 3E at the same time, as shown in FIG. 3D, when the read operation is performed, the sensing circuit 130 may simultaneously receive reading currents IR0 and IR1 generated by the memory cells C0 and C1 through the switches SW0 and SW1 by applying a reading voltage VR to the word line WL0 and simultaneously applying the control signals Y0 and Y1 of the turn-on level ONL to the switches SW0 and SW1. In other words, the memory cells C0 and C1 generate the reading currents IR0 and IR1 respectively based on the reading voltage VR applied to the word line WL0. Also, as shown in FIG. 3E, the control signals Y0 and Y1 change from the turn-off level OFFL to the turn-on level ONL at a same time point t3 to turn on the switch SW0 and the switch SW1 at the same time. A target value of the reading voltage VR is, for example, about 6 volts, but it is usually less than the target value during power-up.

In this way, the sensing circuit 130 may simultaneously receive the reading currents IR0 and IR1 generated by the memory cells C0 and C1, and compare a summed current (IR0+IR1) resulting from the summing of the reading currents IR0 and IR1 with the reference current (e.g., microamperes) to complete the reading operation. For example, when the summed current from the reading currents IR0 and IR1 is greater than the reference current, it means that the erased data (e.g., bit "1") stored in the memory cells C0 and C1 is read. When the summed current from the reading currents IR0 and IR1 is not greater than the reference current, it means that the data stored in the memory cells C0 and C1 that has not been erased is read (e.g., bit "0").

Figure 4:
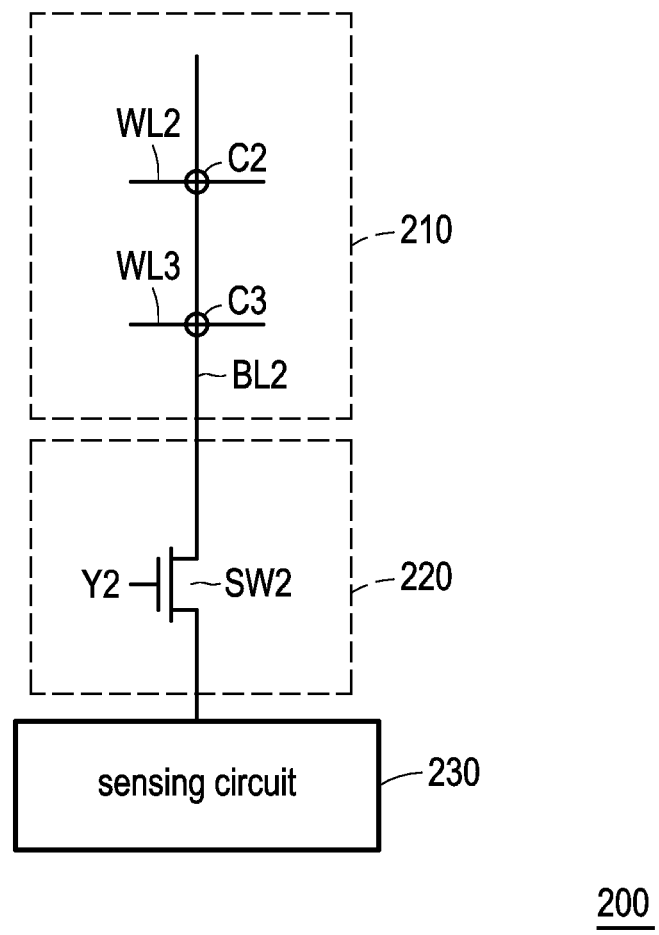
FIG. 4 is a schematic circuit diagram of a semiconductor memory apparatus according to another embodiment of the disclosure.

FIG. 4 is a schematic circuit diagram of a semiconductor memory apparatus according to another embodiment of the disclosure. Referring FIG. 4, a semiconductor memory apparatus 200 includes a memory cell array 210, a switch circuit 220, and a sensing circuit 230. The memory cell array 210 includes memory cells C2 and C3. In this embodiment, the memory cell array 210 is, for example, a mini-array in a NOR flash memory, and the memory cells C2 and C3 are, for example, configured to store the option bits or status bits, but the disclosure is not limited thereto.

As shown in FIG. 4, the memory cells C2 and C3 are respectively coupled to different word lines WL2 and WL3, and are coupled to the switch circuit 220 and the sensing circuit 230 through a common bit line BL2. For ease of understanding, two memory cells are used in this embodiment for illustration purposes, but the disclosure is not limited thereto. As long as it conforms to a circuit structure in which the memory cells are respectively coupled to different word lines and coupled together to the sensing circuit through a common bit line, those skilled in the art may extrapolate a number of the memory cells used to a greater number depending on actual needs according to teachings of the disclosure.

The switch circuit 220 is coupled to the memory cell array 210. The switch circuit 220 includes a switch SW2. The switch SW2 is disposed on the bit line BL2, and is coupled between the memory cells C2 and C3 and the sensing circuit 230.

The switch SW2 receives a control signal Y2. The switch SW2 may be turned on or off under control of the control signal Y2. The switch SW2 may be an electronic component such as a transistor. For example, when the control signal is at a high logic level (a turn-on level ONL), the switch controlled by the control signal will be turned on. When the control signal is at a low logic level (a turn-off level OFFL), the switch controlled by the control signal will be turned off. It should be noted that in other embodiments, the control signal may also control a state of the switch according to a logic level in an opposite manner to the foregoing, and the disclosure is not limited thereto.

The sensing circuit 230 is coupled to the switch circuit 220. The sensing circuit 230 is, for example, a circuit composed of a sense amplifier, and an internal structure, a circuit operation, and implementation of the circuit may be, for example, the same as the sensing circuit 130 according to the foregoing embodiment.

In this embodiment, when an erase verification is performed, the sensing circuit 230 may sequentially receive through the switch circuit 220 an erase verification current IEV2 generated by the memory cell C2 and an erase verification current IEV3 generated by the memory cell C3 to verify an erase state of each of the memory cells C2 and C3.

Figure 5A:
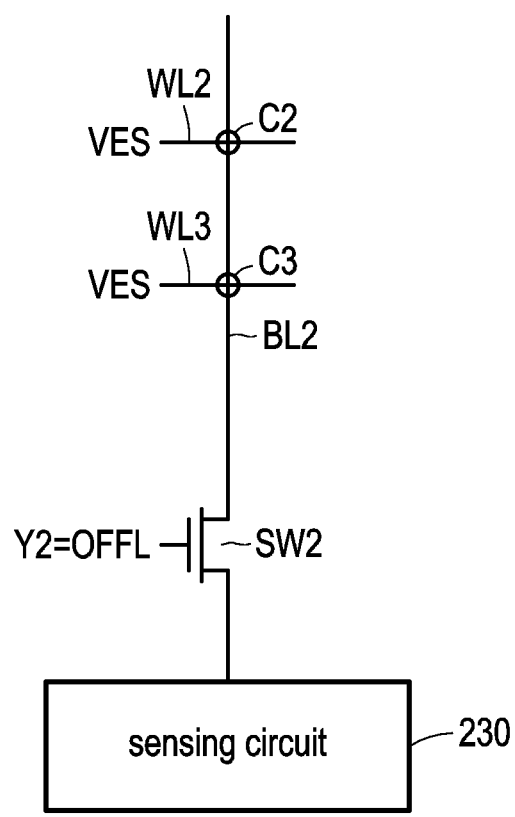
FIG. 5A is a schematic diagram of operation of an erase operation of a semiconductor memory apparatus according to an embodiment of the disclosure.
Figure 5B:
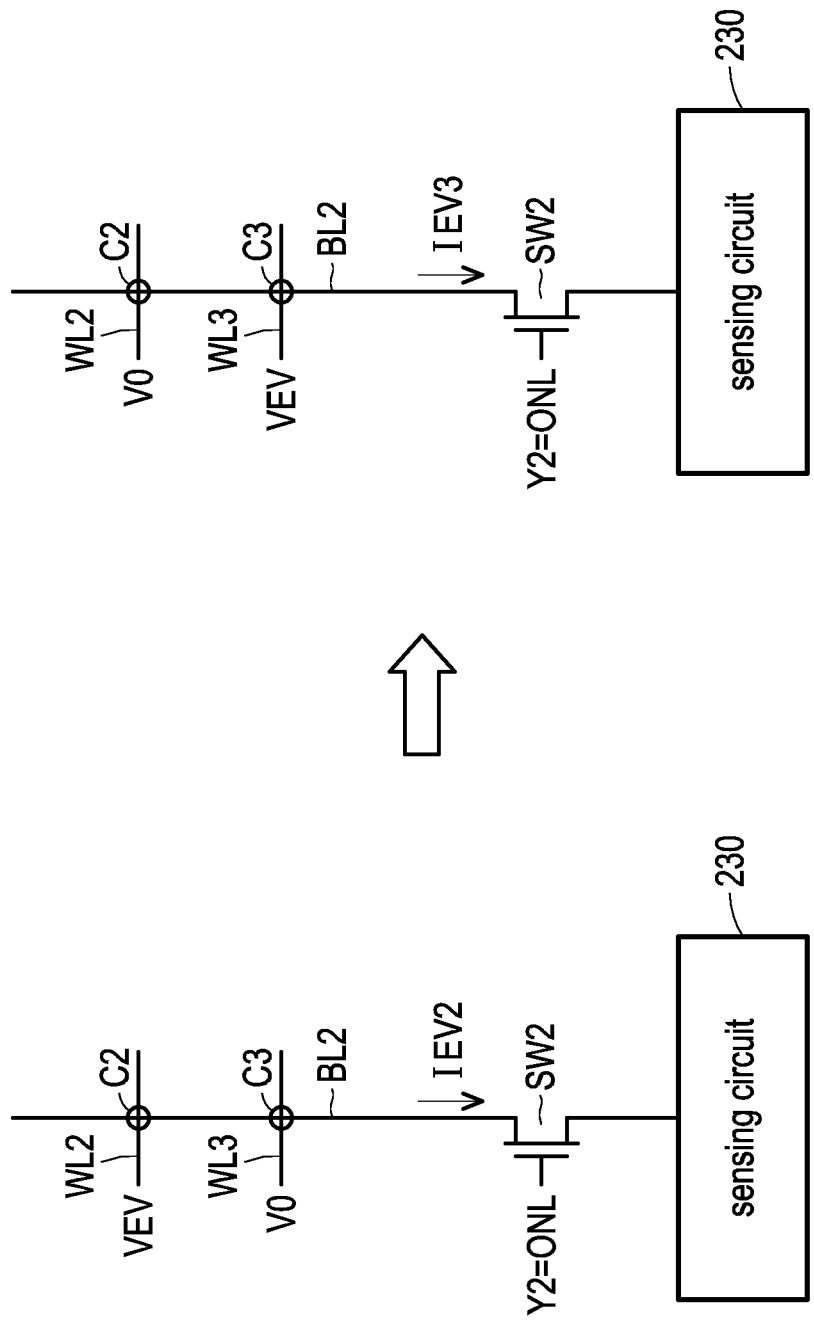
FIG. 5B is a schematic diagram of operation of an erase verification of a semiconductor memory apparatus according to an embodiment of the disclosure.
Figure 5C:
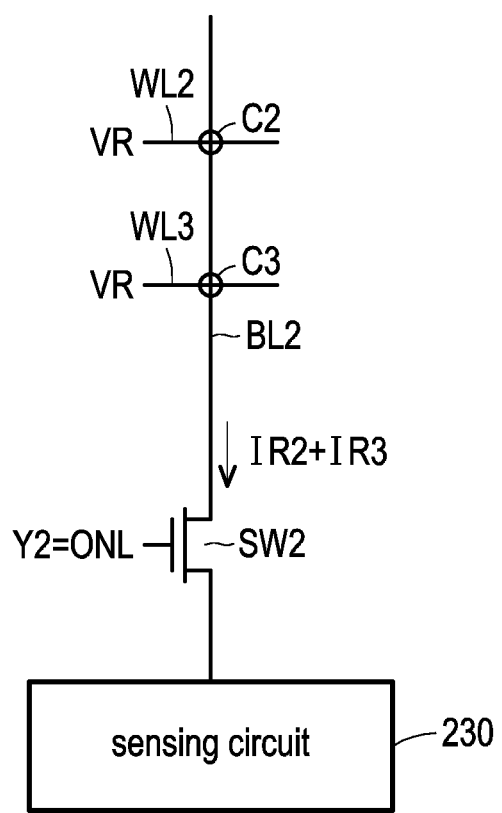
FIG. 5C is a schematic diagram of operation of a read operation of a semiconductor memory apparatus according to an embodiment of the disclosure.

In order to explain in more detail how an erase operation, the erase verification, and a read operation are performed in this embodiment, please refer to FIG. 5A to FIG. 5C for the following description.

FIG. 5A is a schematic diagram of operation of an erase operation of a semiconductor memory apparatus according to an embodiment of the disclosure. Referring FIG. 5A, when the erase operation is performed, the switch SW2 will be turned off based on the control signal Y2 of the turn-off level OFFL, and the memory cells C2 and C3 will be simultaneously erased based on the erase voltage VES applied to the word lines WL2 and WL3. In this way, a data stored in the memory cells C2 and C3 will be erased, for example, to bit "1" to complete the erase operation.

FIG. 5B is a schematic diagram of operation of an erase verification of a semiconductor memory apparatus according to an embodiment of the disclosure. Referring FIG. 5B, when the erase verification is performed, the sensing circuit 230 is enabled to sequentially receive the erase verification currents IEV2 and IEV3 (as shown from left to right in FIG. 5B) generated by the memory cells C2 and C3 by applying the erase verification voltage VEV to the word lines WL2 and WL3, and applying the control signal Y2 of the turn-on level ONL to the switch SW2. In other words, during a period when the control signal Y2 changes from the turn-off level OFFL to the turn-on level ONL to turn on the switch SW2, the erase verification voltage VEV is first applied to the word line WL2 (a voltage VO is applied to the word line WL3 at this time), so that the sense circuit 230 receives the erase verification current IEV2 generated by the memory cell C2. Then, the erase verification voltage VEV is applied to the word line WL3 (the voltage VO is applied to the word line WL2 at this time), so that the sensing circuit 230 receives the erase verification current IEV3 generated by the memory cell C3. The voltage VO is, for example, about 0 volts.

In this way, the sensing circuit 230 may sequentially receive the erase verification current IEV2 generated by the memory cell C2 and the erase verification current IEV3 generated by the memory cell C3, and compare the erase verification currents IEV2 and IEV3 with the reference current respectively to complete the erase verification for memory cells C2 and C3 respectively. For example, when the erase verification current IEV2 is greater than the reference current, it means that the memory cell C2 has passed the erase verification. When the erase verification current IEV2 is not greater than the reference current, it means that the memory cell C2 has not passed the erase verification.

FIG. 5C is a schematic diagram of operation of a read operation of a semiconductor memory apparatus according to an embodiment of the disclosure. The read operation in this embodiment is, for example, a read operation performed during power-up of the semiconductor memory apparatus 100. Referring FIG. 5C, when the read operation is performed, the sensing circuit 230 may simultaneously receive reading currents IR2 and IR3 generated by the memory cells C2 and C3 through the switch SW2 by simultaneously applying the reading voltage VR to the word lines WL2 and WL3, and applying the control signal Y2 of the turn-on level ONL to the switch SW2. In other words, the memory cells C2 and C3 generate the reading currents IR2 and IR3 respectively based on the reading voltage VR applied to the word lines WL2 and WL3. Also, the control signal Y2 changes from the turn-off level OFFL to the turn-on level ONL to turn on the switch SW2.

In this way, the sensing circuit 230 may simultaneously receive the reading currents IR2 and IR3 generated by the memory cells C2 and C3, and compare a summed current (IR2+IR3) resulting from the summing of the reading currents IR2 and IR3 with the reference current to complete the reading operation. For example, when the summed current from the reading currents IR2 and IR3 is greater than the reference current, it means that the erased data (e.g., bit "1") stored in the memory cells C2 and C3 is read. When the summed current from the reading currents IR2 and IR3 is not greater than the reference current, it means that the data stored in the memory cells C2 and C3 that has not been erased is read (e.g., bit "0").

By the operations, the sensing circuit may receive at least two reading currents when the read operation is performed on the option bits or status bits during power-up. Even if the reading voltage applied to the word line does not reach the target value and the reading current decreases, the decrease may be compensated by summing at least two reading currents to increase a margin of the read operation, so that the option bits or status bits may be read correctly.

In summary, the semiconductor memory apparatus of the disclosure may solve a problem that a reading voltage does not reach a target value and the reading current decreases, thereby correctly reading the option bits or status bits during power-on.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor memory apparatus comprising:
a memory cell array comprising a plurality of memory cells, wherein the memory cell array is a mini-array in a NOR flash memory, and the memory cells are configured to store option bits or status bits;
a switch circuit coupled to the memory cell array and comprising at least one switch, wherein each of the at least one switch receives a control signal, and is turned on or off under control of the control signal; and
a sensing circuit coupled to the switch circuit, wherein when an erase verification is performed, the sensing circuit sequentially receives an erase verification current generated by each of the memory cells through the switch circuit to verify an erase state of the each of the memory cells,
wherein when a read operation is performed by applying a reading voltage to the memory cell array during power-up, the sensing circuit simultaneously receives a reading current generated by the each of the memory cells through the switch circuit and compares a summed current resulting from summing of the reading currents with a reference current,
wherein the reading voltage during power-up is less than the erase verification voltage used for verifying the erase state.

2. The semiconductor memory apparatus according to claim 1, wherein the memory cells are coupled to at least one word line, and when an erase operation is performed, the memory cells are simultaneously erased based on an erase voltage applied to the at least one word line.

3. The semiconductor memory apparatus according to claim 1, wherein the memory cells are coupled together to a word line and are respectively coupled to the switch circuit and the sensing circuit through a plurality of different bit lines, and each of the at least one switch is disposed on a corresponding bit line and is coupled between a corresponding memory cell and the sensing circuit.

4. The semiconductor memory apparatus according to claim 3, wherein when the erase verification is performed, the sensing circuit is enabled to sequentially receive the erase verification current generated by the each of the memory cells by applying the erase verification voltage to the word line and sequentially applying the control signal of a turn-on level to the at least one switch.

5. The semiconductor memory apparatus according to claim 4, wherein the at least one switch comprises a first switch and a second switch, and the bit lines comprise a first bit line and a second bit line, wherein the first switch is disposed on the first bit line, the second switch is disposed on the second bit line, and when the erase verification is performed, the semiconductor memory apparatus enables the sensing circuit to sequentially receive the erase verification current generated by the each of the memory cells by sequentially applying the control signal of the turn-on level to the first switch and the second switch.

6. The semiconductor memory apparatus according to claim 1, wherein the memory cells are respectively coupled to a plurality of different word lines, and are coupled to the switch circuit and the sensing circuit through a common bit line, wherein the at least one switch is disposed on the bit line and is coupled between the memory cells and the sensing circuit.

7. The semiconductor memory apparatus according to claim 6, wherein when the erase verification is performed, the sensing circuit is enabled to sequentially receive the erase verification current generated by the each of the memory cells by sequentially applying the erase verification voltage to the word lines and applying the control signal of a turn-on level to the at least one switch.

8. The semiconductor memory apparatus according to claim 7, wherein the word lines comprise a first word line and a second word line, when the erase verification is performed, the erase verification voltage is first applied to the first word line, such that the sensing circuit receives an erase verification current generated by the memory cell coupled to the first word line, and then the erase verification voltage is applied to the second word line, such that the sensing circuit receives an erase verification current generated by the memory cell coupled to the second word line.

* * * * *